United States Patent
Tanaka et al.

(10) Patent No.: US 11,947,263 B2
(45) Date of Patent: Apr. 2, 2024

(54) LASER CHAMBER AND ELECTRONIC DEVICE MANUFACTURING METHOD

(71) Applicant: Gigaphoton Inc., Tochigi (JP)

(72) Inventors: Makoto Tanaka, Oyama (JP); Yosuke Fujimaki, Oyama (JP); Takashi Ito, Oyama (JP); Yousuke Kawagoe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 216 days.

(21) Appl. No.: 17/457,514

(22) Filed: Dec. 3, 2021

(65) Prior Publication Data
US 2022/0091515 A1    Mar. 24, 2022

Related U.S. Application Data

(63) Continuation of application No. PCT/JP2019/026416, filed on Jul. 3, 2019.

(51) Int. Cl.
*G03F 7/20*    (2006.01)
*F04D 23/00*    (2006.01)
(Continued)

(52) U.S. Cl.
CPC ......... *G03F 7/70025* (2013.01); *F04D 23/00* (2013.01); *F04D 29/667* (2013.01); *H01S 3/036* (2013.01); *H01S 3/225* (2013.01)

(58) Field of Classification Search
CPC .... G03F 7/70025; F04D 23/00; F04D 29/667; F04D 29/283; F04D 29/441; F04D 17/04;
(Continued)

(56) References Cited

U.S. PATENT DOCUMENTS

| 6,034,984 A | 3/2000 | Hofmann et al. |
| 6,061,376 A | 5/2000 | Hofmann et al. |

(Continued)

FOREIGN PATENT DOCUMENTS

| CN | 102812253 A | 12/2012 |
| CN | 105247221 A | 1/2016 |

(Continued)

OTHER PUBLICATIONS

An Office Action mailed by China National Intellectual Property Administration dated Mar. 31, 2023, which corresponds to Chinese Patent Application No. 201980097086.5 and is related to U.S. Appl. No. 17/457,514; with English language translation.

(Continued)

*Primary Examiner* — Mesfin T Asfaw
(74) *Attorney, Agent, or Firm* — Studebaker & Brackett PC

(57) ABSTRACT

A laser chamber of a discharge-excitation-type gas laser apparatus may include a container which contains laser gas therein; a pair of discharge electrodes arranged in the container; a cross flow fan configured to supply the laser gas to a discharge space between the discharge electrodes, the cross flow fan including a rotation shaft with which the cross flow fan rotates in a predetermined rotation direction and a plurality of blades, each longitudinal direction of which is parallel to an axial direction of the rotation shaft; and a stabilizer arranged outside a rotation trajectory of the cross flow fan, and arranged such that a difference between a maximum position and a minimum position of an end portion in the rotation direction on a side opposite to the rotation direction is larger than 0 and is smaller than an interval of two blades adjacent to each other among the plurality of blades.

14 Claims, 10 Drawing Sheets

(51) Int. Cl.
*F04D 29/66* (2006.01)
*G03F 7/00* (2006.01)
*H01S 3/036* (2006.01)
*H01S 3/225* (2006.01)

(58) Field of Classification Search
CPC ...... H01S 3/036; H01S 3/225; H01S 3/09705; H01S 3/0979; F05D 2250/182; F05D 2250/183; F05D 2250/52
See application file for complete search history.

(56) References Cited

U.S. PATENT DOCUMENTS

| | | | |
|---|---|---|---|
| 6,188,709 B1 | 2/2001 | Webb | |
| 6,847,671 B1 * | 1/2005 | Baumler | .................. H01S 3/03 372/55 |
| 7,031,364 B2 * | 4/2006 | Sano | ....................... H01S 3/036 372/55 |

FOREIGN PATENT DOCUMENTS

| | | |
|---|---|---|
| EP | 1 780 475 A2 | 5/2007 |
| EP | 2 549 114 A1 | 1/2013 |
| JP | S59-41696 U | 3/1984 |
| JP | S61-226595 A | 10/1986 |
| JP | S64-63697 A | 3/1989 |
| JP | 2007-120880 A | 5/2007 |
| JP | 4045072 B2 | 2/2008 |
| JP | 2014-062465 A | 4/2014 |

OTHER PUBLICATIONS

International Search Report issued in PCT/JP2019/026416; dated Sep. 10, 2019.
International Preliminary Report on Patentability (Chapter I) and Written Opinion of the International Searching Authority issued in PCT/JP2019/026416; dated Dec. 28, 2021.
An Office Action mailed by the Japanese Patent Office dated May 9, 2023, which corresponds to Japanese Patent Application No. 2021-529620 and is related to U.S. Appl. No. 17/457,514; with English language translation.

* cited by examiner

LASER CHAMBER AND ELECTRONIC DEVICE MANUFACTURING METHOD

CROSS-REFERENCE TO RELATED APPLICATIONS

The present application claims the benefit of International Application No. PCT/JP2019/026416, filed on Jul. 3, 2019, the entire contents of which are hereby incorporated by reference.

BACKGROUND

1. Technical Field

The present disclosure relates to a laser chamber and an electronic device manufacturing method.

2. Related Art

Improvement in resolution of a semiconductor exposure apparatus has been desired for miniaturization and high integration of semiconductor integrated circuits. Hereinafter, a semiconductor exposure apparatus is simply referred to as an "exposure apparatus." For this purpose, an exposure light source that outputs light having a shorter wavelength has been developed. As the exposure light source, a gas laser apparatus is used in place of a conventional mercury lamp. As a gas laser apparatus for exposure, a KrF excimer laser apparatus that outputs ultraviolet light having a wavelength of 248 nm and an ArF excimer laser apparatus that outputs ultraviolet light having a wavelength of 193 nm are currently used.

As current exposure technology, immersion exposure is practically used in which a gap between a projection lens of an exposure apparatus and a wafer is filled with a liquid and a refractive index of the gap is changed to reduce an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure. The ArF immersion exposure is also referred to as ArF immersion lithography.

Since the KrF excimer laser apparatus and the ArF excimer laser apparatus have a large spectral line width of about 350 to 400 pm in natural oscillation, chromatic aberration of laser light (ultraviolet light), which is reduced and projected on a wafer by a projection lens of an exposure apparatus, occurs to deteriorate resolution. Then, a spectral line width of laser light output from the gas laser apparatus needs to be narrowed to the extent that the chromatic aberration can be ignored. The spectral line width is also referred to as a spectral width. For this purpose, a line narrowing module (LNM) having a line narrowing element is provided in a laser resonator of the gas laser apparatus to narrow the spectral width. The line narrowing element may be an etalon, a grating, or the like. A laser apparatus with such a narrowed spectral width is referred to as a line narrowing laser apparatus.

LIST OF DOCUMENTS

Patent Documents

Patent Document 1: U.S. Pat. No. 6,061,376
Patent Document 2: U.S. Pat. No. 6,034,984
Patent Document 3: Japanese Patent Application Publication No. H01-063697
Patent Document 4: Japanese Patent Application Publication No. 2014-062465

SUMMARY

A laser chamber of a discharge-excitation-type gas laser apparatus according to an aspect of the present disclosure may include a container which contains laser gas therein; a pair of discharge electrodes arranged in the container; a cross flow fan configured to supply the laser gas to a discharge space between the discharge electrodes, the cross flow fan including a rotation shaft with which the cross flow fan rotates in a predetermined rotation direction and a plurality of blades, each longitudinal direction of which is parallel to an axial direction of the rotation shaft; and a stabilizer arranged outside a rotation trajectory of the cross flow fan, and arranged such that a difference between a maximum position and a minimum position of an end portion in the rotation direction on a side opposite to the rotation direction is larger than 0 and is smaller than an interval of two blades adjacent to each other among the plurality of blades.

An electronic device manufacturing method according to an aspect of the present disclosure may include generating laser light using an excimer laser apparatus including a laser chamber, emitting the laser light to an exposure apparatus, and exposing a photosensitive substrate to the laser light in the exposure apparatus to manufacture an electronic device. Here, the laser chamber may include a container which contains laser gas therein; a pair of discharge electrodes arranged in the container; a cross flow fan configured to supply the laser gas to a discharge space between the discharge electrodes, the cross flow fan including a rotation shaft with which the cross flow fan rotates in a predetermined rotation direction and a plurality of blades, each longitudinal direction of which is parallel to an axial direction of the rotation shaft; and a stabilizer arranged outside a rotation trajectory of the cross flow fan, and arranged such that a difference in the rotation direction between a maximum position and a minimum position of an end portion on a side opposite to the rotation direction is larger than 0 and is smaller than an interval of two blades adjacent to each other among the plurality of blades.

BRIEF DESCRIPTION OF THE DRAWINGS

Embodiments of the present disclosure will be described below merely as examples with reference to the accompanying drawings.

DESCRIPTION OF EMBODIMENTS

Figure 1A:
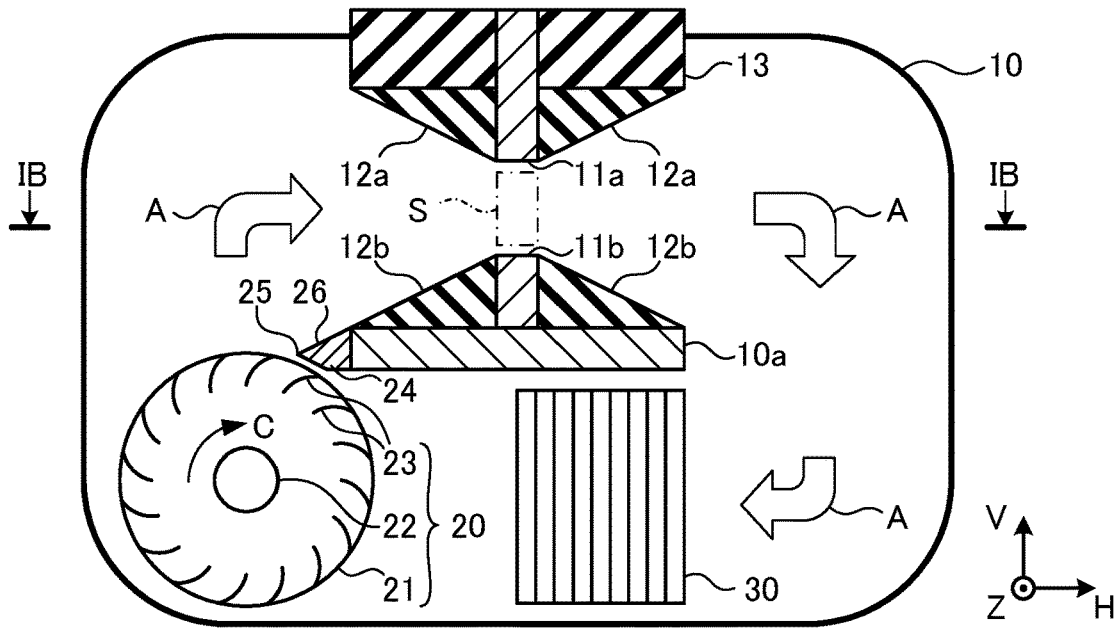
FIG. 1A is a sectional view schematically showing the configuration of a laser chamber of a discharge-excitation-type gas laser apparatus according to a comparative example.

<Contents>
1. Comparative Example
    1.1 Configuration of laser chamber
    1.2 Operation of laser chamber
    1.3 Problem
2. Laser chamber with step at end portion of stabilizer
    2.1 Configuration of first example
    2.2 Effect of first example
    2.3 Second example
    2.4 Detail of stabilizer
    2.5 Simulation of pressure fluctuation
3. Cycle P at position f(Z) of end portion
    3.1 Configuration
    3.2 Effect
4. Inclination angle of bottom surface of groove
    4.1 Configuration
    4.2 Effect
5. Stepped end portion
    5.1 Configuration
    5.2 Effect
6. Triangular-wave-shaped end portion
    6.1 Configuration
    6.2 Effect
7. Relation with partition plate
    7.1 Configuration
    7.2 Effect
8. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Comparative Example

1.1 Configuration of Laser Chamber

Figure 1B:
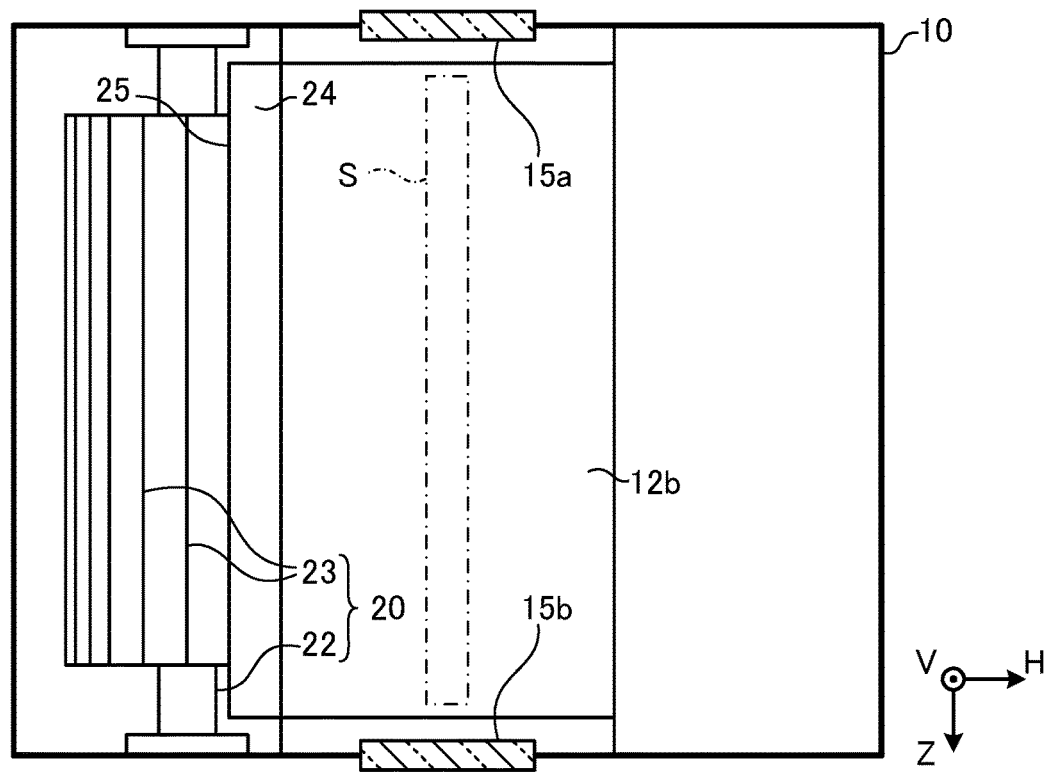
FIG. 1B is a sectional view schematically showing the configuration of the laser chamber of the discharge-excitation-type gas laser apparatus according to the comparative example.

FIGS. 1A and 1B are sectional views schematically showing the configuration of a laser chamber of a discharge-excitation-type gas laser apparatus according to a comparative example. The discharge-excitation-type gas laser apparatus is, for example, an excimer laser apparatus. FIG. 1A shows the internal configuration of the laser chamber viewed in a direction substantially parallel to a travel direction of laser light output from the laser chamber. FIG. 1B shows the internal configuration of the laser chamber viewed in a direction substantially parallel to a discharge direction between a pair of discharge electrodes 11a, 11b. FIG. 1B corresponds to a sectional view along line IB-IB in FIG. 1A.

The travel direction of the laser light output from the laser chamber is represented by the +Z direction. The discharge direction between the discharge electrodes 11a, 11b is represented by the +V direction or the −V direction. A direction perpendicular to the both is represented by the +H direction or the −H direction. The −V direction substantially coincides with the direction of gravity. The +H direction substantially coincides with the direction in which laser gas flows between the discharge electrodes 11a, 11b.

The laser chamber includes a container 10, the discharge electrodes 11a, 11b, a cross flow fan 20, and a heat exchanger 30.

The container 10 is arranged in an optical path of a laser resonator (not shown). The container 10 is provided with two windows 15a, 15b. The discharge electrodes 11a, 11b are arranged in the container 10. The container 10 contains laser gas as a laser medium therein. The laser gas includes, for example, argon gas, fluorine gas, and neon gas. Alternatively, the laser gas includes, for example, krypton gas, fluorine gas, and neon gas.

An opening is formed in a part of the container 10, and the opening is closed by an electrically insulating portion 13. The electrically insulating portion 13 supports the discharge electrode 11a. A guide member 12a having a tapered surface is arranged on each of the two sides of the discharge electrode 11a.

A return plate 10a is arranged inside the container 10. The return plate 10a supports the discharge electrode 11b. A guide member 12b having a tapered surface is arranged on each of the two sides of the discharge electrode 11b.

The tapered surfaces of the guide members 12a, 12b configure a part of a wall surface of a flow path of the laser gas passing through a discharge space S between the discharge electrodes 11a, 11b.

The cross flow fan 20 is arranged in the container 10. The cross flow fan 20 includes a rotation shaft 22 and a plurality of blades 23. The rotation shaft 22 is connected to a motor (not shown). The respective blades 23 are arranged such that the longitudinal direction thereof is substantially parallel to the axial direction of the rotation shaft 22. The respective blades 23 are arranged such that the distances from the rotation shaft 22 are substantially equal to each other, and that intervals between any two adjacent blades 23 are substantially equal to each other.

A stabilizer 24 is arranged outside an outer edge 21 of a rotation trajectory of the blades 23. The stabilizer 24 is arranged close to the outer edge 21. The stabilizer 24 is supported by the return plate 10a. The longitudinal direction of the stabilizer 24 is substantially parallel to the rotation shaft 22 of the cross flow fan 20. The stabilizer 24 includes a guide surface 26. The guide surface 26 configures a part of the wall surface of the flow path of the laser gas flowing toward the discharge space S.

1.2 Operation of Laser Chamber

When the motor drives the rotation shaft 22, the cross flow fan 20 rotates in a rotation direction indicated by arrow C, and laser gas flow is generated in a direction crossing the rotation shaft 22. The flow rate distribution of the laser gas flow in the axial direction of the rotation shaft 22 is substantially uniform. The laser gas circulates inside the container 10 as indicated by arrow A. Thus, the cross flow fan 20 supplies the laser gas to the discharge space S between the discharge electrodes 11a, 11b.

The heat exchanger 30 exhausts the thermal energy of the laser gas to the outside of the container 10.

When a pulse high voltage is applied between the discharge electrodes 11a, 11b, discharge occurs in the discharge space S. The laser gas present in the discharge space S is excited by the energy of the discharge and shifts to a high energy level. When the excited laser gas then shifts to a low energy level, light having a wavelength corresponding to the difference between the energy levels is emitted.

The light generated in the discharge space S is emitted to the outside of the container 10 through the windows 15a, 15b. The light emitted to the outside of the container 10 is reciprocated on an optical path including the discharge space S by an optical resonator. This light is amplified every time it passes through the discharge space S. In this way, laser oscillation is performed, and pulse laser light is output from a partial reflection mirror configuring the optical resonator.

1.3 Problem

Figure 1C:
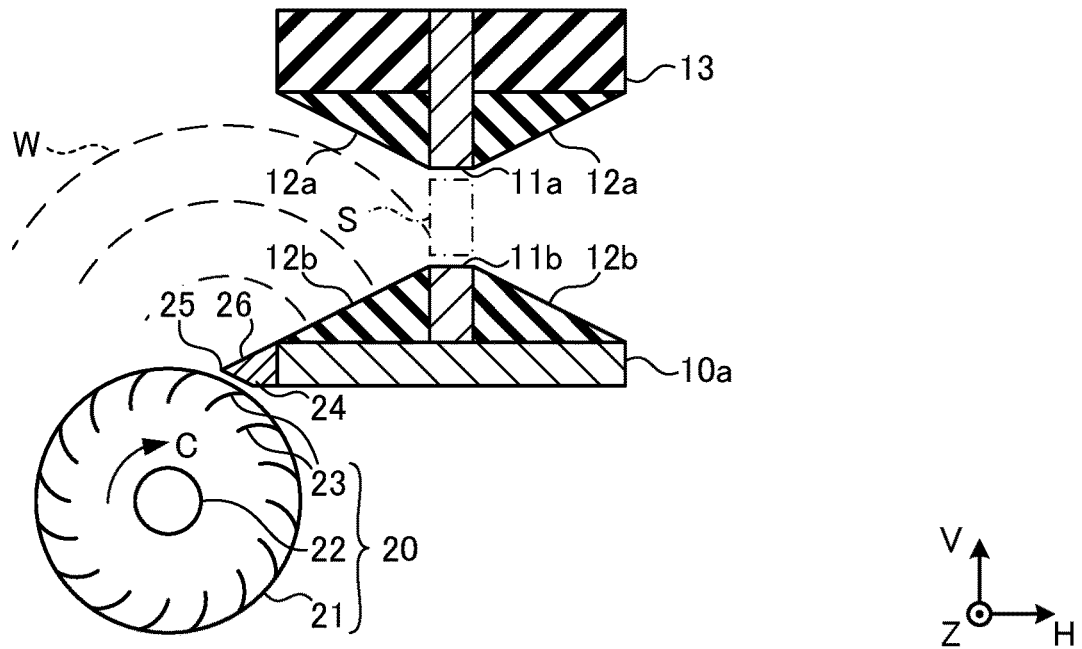
FIG. 1C is a sectional view schematically showing a state in which acoustic waves are generated between a cross flow fan and a stabilizer.

FIG. 1C is a sectional view schematically showing a state in which acoustic waves W are generated between the cross flow fan 20 and the stabilizer 24. FIG. 1C shows the configuration shown in FIG. 1A as omitting components such as the container 10 and the heat exchanger 30.

Figure 1D:
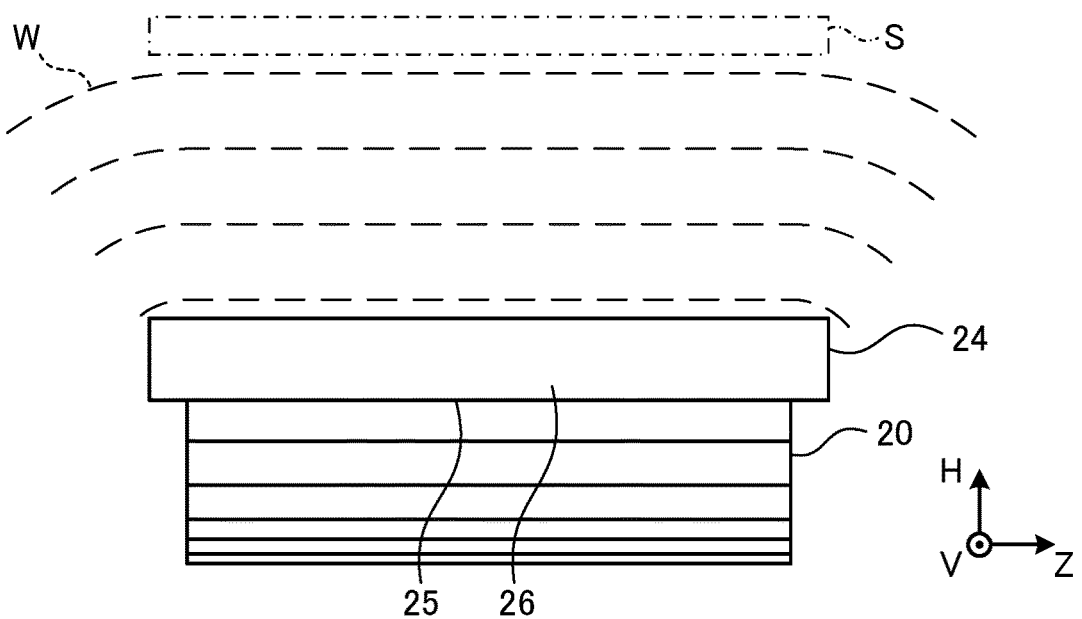
FIG. 1D is a plan view schematically showing a state in which acoustic waves are generated between the cross flow fan and the stabilizer.

FIG. 1D is a plan view schematically showing a state in which acoustic waves W are generated between the cross flow fan 20 and the stabilizer 24. FIG. 1D shows the configuration shown in FIG. 1B as omitting components such as the container 10, the guide member 12b, the windows 15a, 15b, and the rotation shaft 22.

Each time the cross flow fan 20 is rotated in the rotation direction indicated by arrow C and one blade 23 passes the vicinity of an end portion 25 of the stabilizer 24, the laser gas in the vicinity of the end portion 25 of the stabilizer 24 is compressed and expanded. The end portion 25 is an end part on a side opposite to the rotation direction of the cross flow fan 20. As the laser gas is repeatedly compressed and expanded in the vicinity of the end portion 25, the acoustic waves W are generated. The acoustic wave W is a compression wave having laser gas as a medium. The frequency f of the acoustic wave W corresponds to a value obtained by multiplying the number of revolutions per second of the cross flow fan 20 by the number of blades 23. The wavelength $\lambda$ of the acoustic wave W corresponds to a value obtained by dividing the sound velocity a at the inside of the container 10 by the frequency f of the acoustic wave W.

The acoustic wave W may propagate from the vicinity of the end portion 25 of the stabilizer 24 toward the periphery thereof and reach the discharge space S. When the acoustic wave W reaches the discharge space S, the density distribution of the laser gas excited in the discharge space S changes, and laser oscillation may become unstable.

In the embodiments described below, the position f(Z) of the end portion 25 of the stabilizer 24 in the rotation direction of the cross flow fan 20 differs in accordance with the position Z of the end portion 25 in the axial direction of the cross flow fan 20. Thus, the timing at which the acoustic waves W are generated is shifted, and the stability of laser oscillation is improved.

2. Laser Chamber with Step at End Portion of Stabilizer

2.1 Configuration of First Example

Figure 2:
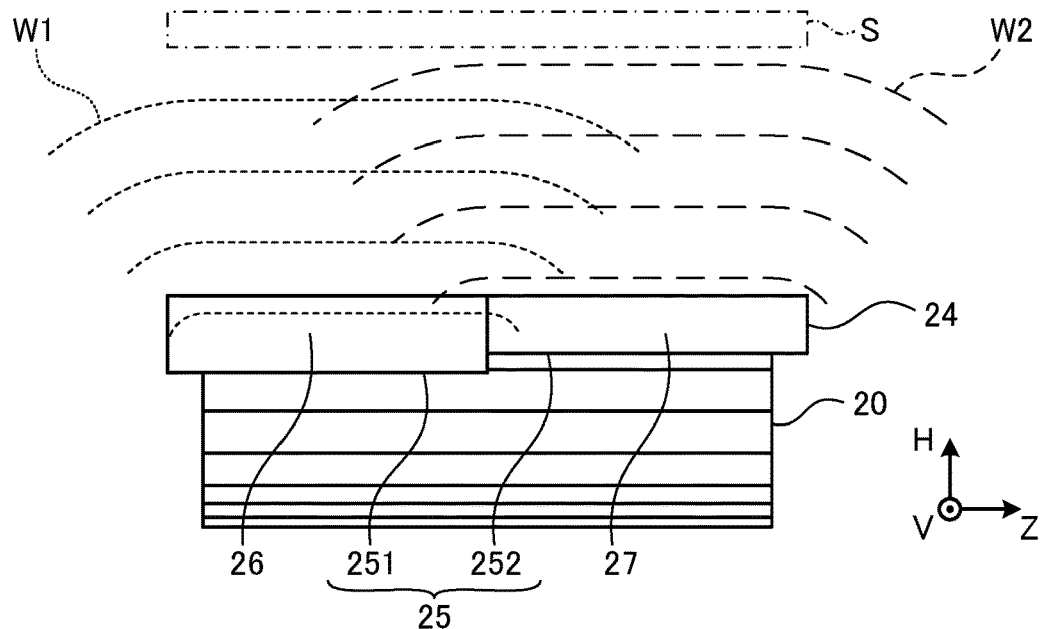
FIG. 2 is a plan view schematically showing a state in which acoustic waves are generated between the cross flow fan and the stabilizer in a first example of a first embodiment of the present disclosure.

FIG. 2 is a plan view schematically showing a state in which acoustic waves W1, W2 are generated between the cross flow fan 20 and the stabilizer 24 in a first example of a first embodiment of the present disclosure. FIG. 2 shows the configuration of a section corresponding to FIG. 1D. In the first example, the end portion 25 of the stabilizer 24 includes a first portion 251 and a second portion 252. The first portion 251 and the second portion 252 are different from each other in position in the rotation direction of the cross flow fan 20.

A groove is formed on the guide surface 26 of the stabilizer 24, and the groove has a bottom surface 27. The first portion 251 of the end portion 25 corresponds to an end part of a portion of the guide surface 26 where the groove is not formed. The second portion 252 of the end portion 25 corresponds to an end part of the bottom surface 27 of the groove.

In other respects, the first example is similar to the comparative example.

2.2 Effect of First Example

In the first example, the timing at which the acoustic wave W1 is generated in the vicinity of the first portion 251 of the end portion 25 is shifted from the timing at which the acoustic wave W2 is generated in the vicinity of the second portion 252 of the end portion 25. Preferably, the difference between these timings corresponds to half of the cycle 1/f of the acoustic waves W1, W2. The cycle 1/f of the acoustic waves W1, W2 is the inverse of the frequency f of the acoustic waves W1, W2. Assuming that the wavelength λ of the acoustic waves W1, W2 is sufficiently large with respect to the positional shift between the first portion 251 and the second portion 252, when the timing shift between the acoustic waves W1, W2 corresponds to half of the cycle 1/f of the acoustic waves W1, W2, the acoustic waves W1, W2 having a phase difference of about 180° reach the discharge space S.

At least a part of the acoustic waves W1, W2 weaken each other due to interference. Thus, the state of the discharge in the discharge space S is stabilized and the stability of laser oscillation is improved.

Some parts of the acoustic waves W1, W2 may not weaken each other. However, since the phases of the acoustic waves W1, W2 are shifted from each other, the stability of the discharge can be improved as compared with the comparative example. That is, for example, even if the discharge becomes unstable due to the influence of the acoustic wave W1 in a part of the discharge space S in the longitudinal direction, normal discharge may occur in another part because the phase of the acoustic wave W2 is different from the phase of the acoustic wave W1. Thus, the stability of laser oscillation may be improved.

2.3 Second Example

Figure 3:
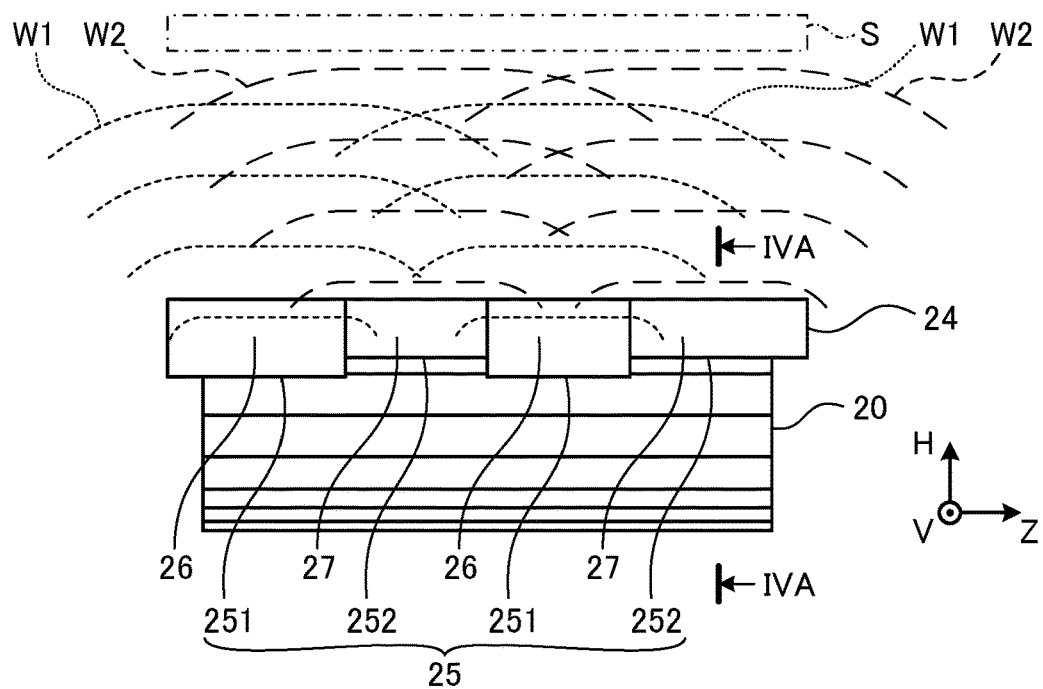
FIG. 3 is a plan view schematically showing a state in which acoustic waves are generated in a second example of the first embodiment.

FIG. 3 is a plan view schematically showing a state in which the acoustic waves W1, W2 are generated in a second example of the first embodiment. In the second example, the end portion 25 of the stabilizer 24 includes a plurality of the first portions 251 and a plurality of the second portions 252. The first portions 251 and the second portions 252 are alternately arranged.

A plurality of grooves are formed on the guide surface 26, and each groove has the bottom surface 27.

In the second example, compared to the first example described with reference to FIG. 2, the number of the first portions 251 and the second portions 252 is increased and the width of each of the first portions 251 and the width of each of the second portions 252 are narrowed. Thus, many parts of the acoustic waves W1, W2 can interfere with and weaken each other. Accordingly, the state of the discharge in the discharge space S is stabilized and the stability of laser oscillation may be improved.

In other respects, the second example is similar to the first example described with reference to FIG. 2.

2.4 Detail of Stabilizer

Figure 4A:
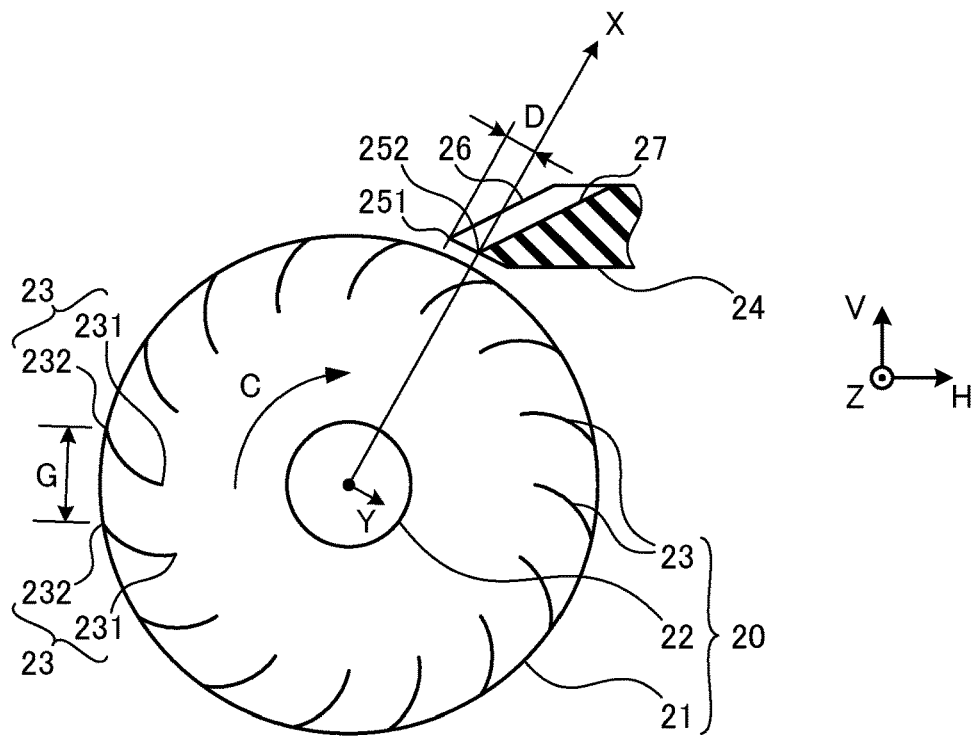
FIG. 4A is an enlarged view of a cross-section along line IVA-IVA in FIG. 3.
Figure 4B:
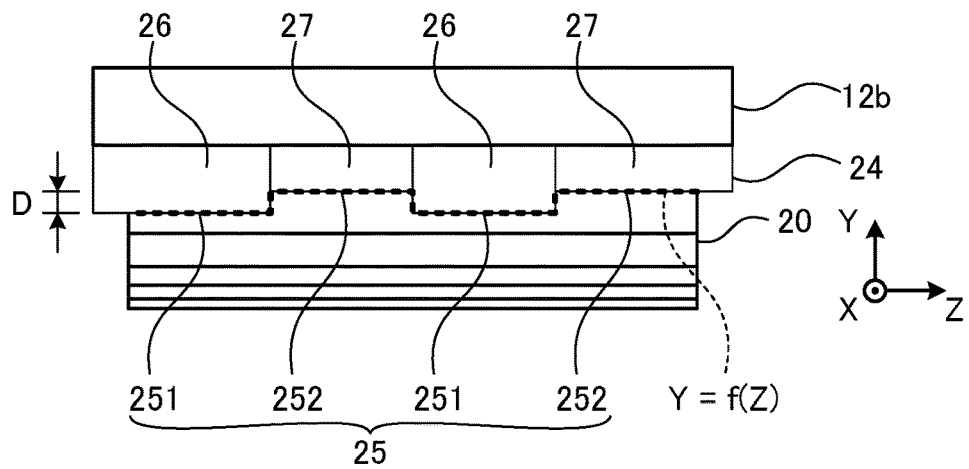
FIG. 4B is a view of the stabilizer shown in FIG. 4A viewed in the −X direction.

FIG. 4A is an enlarged view of a cross-section along line IVA-IVA in FIG. 3. FIG. 4B is a view of the stabilizer 24 shown in FIG. 4A viewed in the −X direction. FIGS. 4A and 4B show the configuration of the stabilizer 24 of the first embodiment.

As shown in FIG. 4A, the guide surface 26 is inclined with respect to the radial direction of the cross flow fan 20. The stabilizer 24 is arranged such that the guide surface 26 is inclined in a desired angle range so as to efficiently supply the laser gas to the discharge space S. The bottom surfaces 27 of the grooves are also preferably in the desired angle range. For example, the bottom surfaces 27 of the grooves are preferably parallel to the guide surface 26.

Next, the maximum value and the minimum value of the position f(Z) of the end portion 25 of the stabilizer 24 in the rotation direction of the cross flow fan 20 and the difference D therebetween will be described.

An imaginary straight line extending from the center of the rotation shaft 22 of the cross flow fan 20 perpendicularly to the axial direction of the rotation shaft 22 toward the second portion 252 of the end portion 25 of the stabilizer 24 is defined as an X axis. An axis perpendicular to both the axial direction of the rotation shaft 22 and the X axis is defined as a Y axis. Then, the difference between the Y coordinates of the first portion 251 and the second portion 252 of the end portion 25 is defined as the difference D between the maximum value and the minimum value of the position f(Z) of the end portion 25. The maximum value of the position f(Z) corresponds to the maximum position in the present disclosure, and the minimum value of the position f(Z) corresponds to the minimum position in the present disclosure.

As indicated by a broken line in FIG. 4B, the position f(Z) of the end portion 25 depends on the position Z of the end portion 25 in the axial direction of the cross flow fan 20. The position f(Z) of the end portion 25 changes in a rectangular wave shape along the first portions 251 and the second portions 252. The position f(Z) of the end portion 25 takes the minimum value at the first portions 251, and the position f(Z) of the end portion 25 takes the maximum value at the second portions 252. The minimum value of the position f(Z) of the end portion 25 corresponds to the first value in the present disclosure, and the maximum value of the position f(Z) of the end portion 25 corresponds to the second value in the present disclosure.

An end part of each blade 23 on the center side of the cross flow fan 20 is referred to as a first end portion 231, and an end part on the outer side of the cross flow fan 20 is referred to as a second end portion 232. The distance between the second end portions 232 of adjacent two blades 23 is referred to as a blade interval G.

The difference between a timing at which one blade 23 of the cross flow fan 20 passes the vicinity of the first portion 251 and the timing at which the blade 23 passes the vicinity of the second portion 252 depends on the difference D between the maximum value and the minimum value of the position f(Z) of the end portion 25.

When the difference D between the maximum value and the minimum value of the position f(Z) of the end portion 25 is 0, the timing at which one blade 23 passes the vicinity of the first portion 251 is the same as the timing at which the blade 23 passes the vicinity of the second portion 252.

When the difference D between the maximum value and the minimum value of the position f(Z) of the end portion 25 is equal to the blade interval G, the timing at which one blade 23 passes the vicinity of the first portion 251 is the same as the timing at which the adjacent blade 23 passes the vicinity of the second portion 252.

In these two cases, since the timing at which the acoustic wave W1 is generated in the vicinity of the first portion 251 and the timing at which the acoustic wave W2 is generated in the vicinity of the second portion 252 are substantially equal to each other, a significant difference in phase cannot be provided between the acoustic waves W1, W2.

Therefore, in order to provide a phase difference between the acoustic waves W1, W2, the difference D between the maximum value and the minimum value of the position f(Z) of the end portion 25 is preferably larger than 0 and smaller than the blade interval G.

The difference D between the maximum value and the minimum value of the position f(Z) of the end portion 25 is preferably larger than one quarter of the blade interval G and smaller than three quarters of the blade interval G, and is more preferably about one half of the blade interval G.

Here, although FIGS. 4A and 4B are described based on the second example of the first embodiment, the same applies to the first example.

2.5 Simulation of Pressure Fluctuation

Figure 5A:
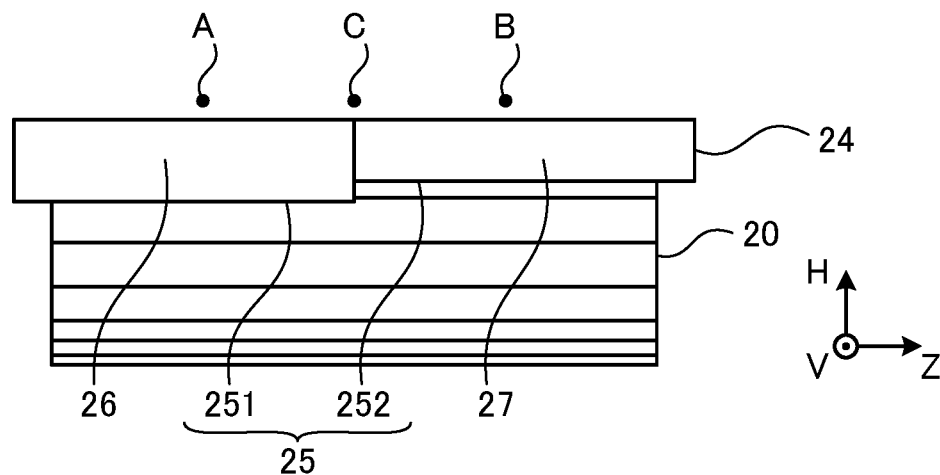
FIG. 5A is a plan view for explaining conditions for a simulation of pressure fluctuation in the first embodiment.

FIG. 5A is a plan view for explaining conditions for a simulation of pressure fluctuation in the first embodiment. FIG. 5A shows the section corresponding to FIG. 2. Pressure fluctuation due to acoustic waves was simulated at the following three points A to C shown in FIG. 5A.

Figure 5B:
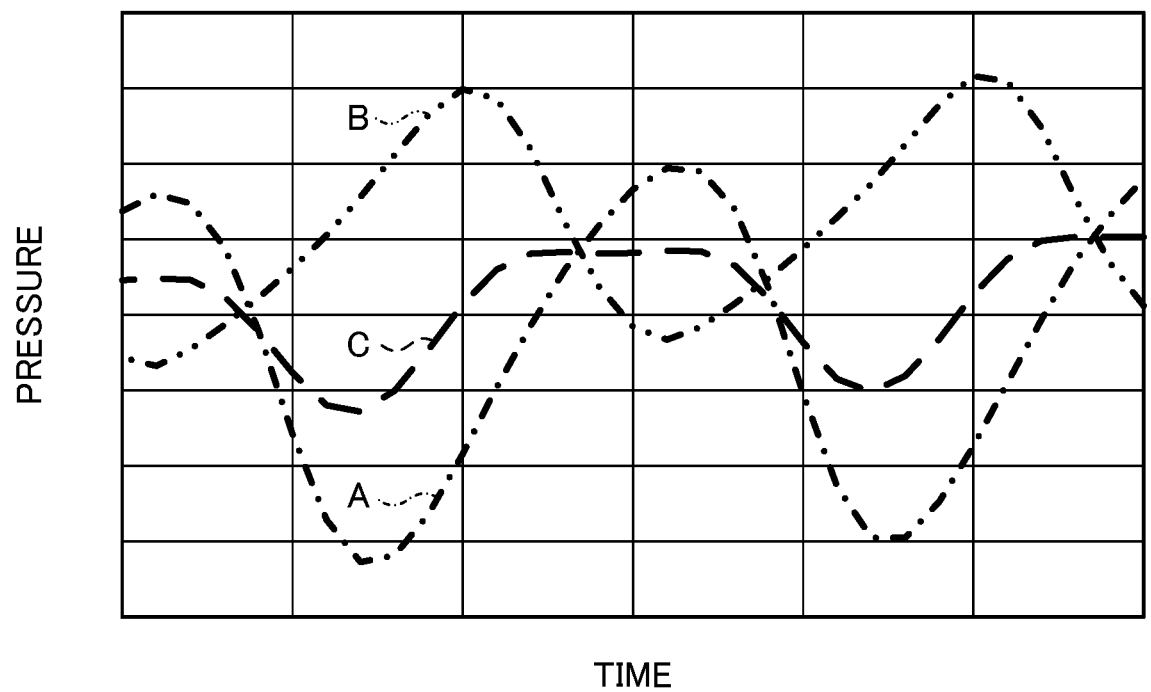
FIG. 5B is a graph showing a simulation result.

Point A: A predetermined position between the guide surface 26 and the discharge space S Point B: A predetermined position between the groove having the bottom surface 27 and the discharge space S Point C: A predetermined position between the discharge space S and a boundary part between the guide surface 26 and the groove FIG. 5B is a graph showing a simulation result. The horizontal axis of FIG. 5B shows time, and the length of time shown in FIG. 5B corresponds to about twice the cycle 1/f of the acoustic waves W1, W2. The vertical axis of FIG. 5B shows pressure.

Among the three points A to C, the largest amount of pressure displacement was at point A, followed by point B. Point A and point B were different in phase by about 180°. At point C, the displacement amount of pressure was smaller than both points A, B, and the pressure was stable.

According to the first embodiment, the acoustic waves W1, W2 having different phases are caused to interfere with each other, thereby the displacement amount of pressure can be reduced. Thus, the state of the discharge in the discharge space S is stabilized and the stability of laser oscillation may be improved.

Here, although FIGS. 5A and 5B are described based on the first example of the first embodiment, the effect of reducing the displacement amount of pressure due to the interference of the acoustic waves W1, W2 can be expected to be further enhanced in the second example.

3. Cycle P at position f(Z) of end portion

3.1 Configuration

Figure 6:
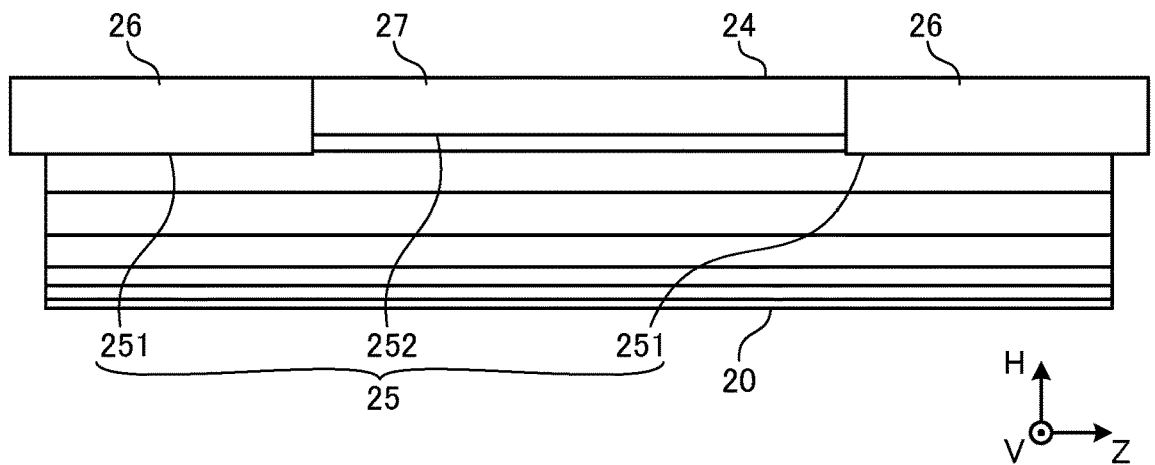
FIG. 6 is a plan view showing the configuration of the stabilizer used in the laser chamber according to a first example of a second embodiment of the present disclosure.

FIG. 6 is a plan view showing the configuration of the stabilizer 24 used in the laser chamber according to a first example of a second embodiment of the present disclosure. One groove is formed on the guide surface 26 of the stabilizer 24, and the groove may have the bottom surface 27.

Figure 7:
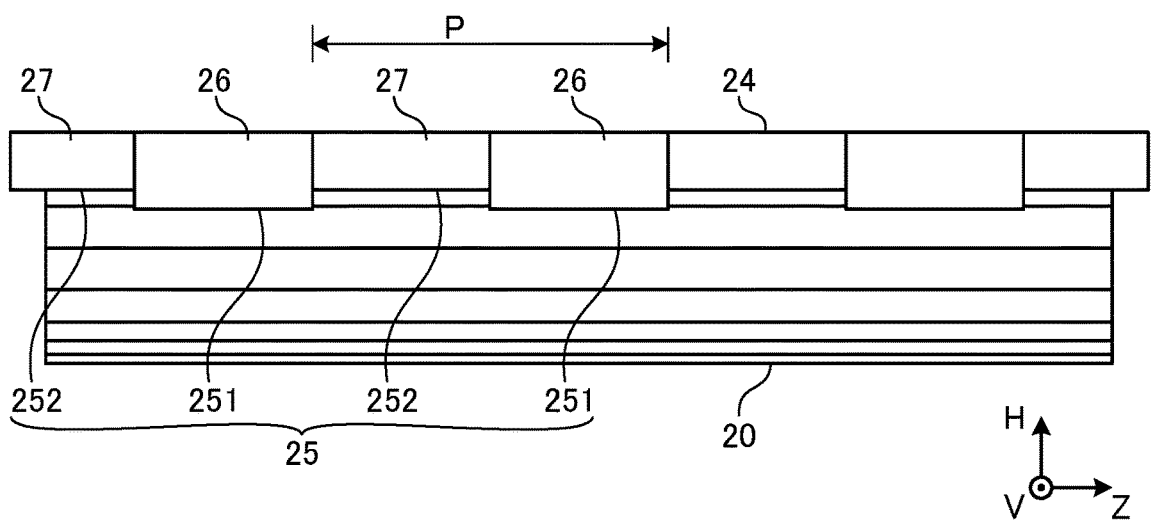
FIG. 7 is a plan view showing the configuration of the stabilizer used in the laser chamber according to a second example of the second embodiment.

FIG. 7 is a plan view showing the configuration of the stabilizer 24 used in the laser chamber according to a second example of the second embodiment. A plurality of grooves are formed on the guide surface 26 of the stabilizer 24, and each groove may have the bottom surface 27.

Figure 8:
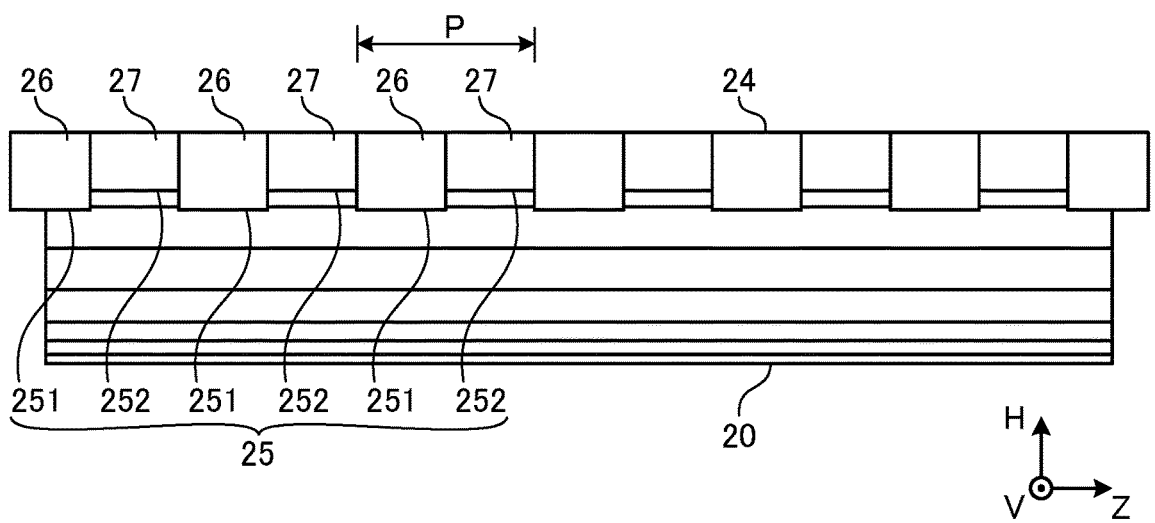
FIG. 8 is a plan view showing the configuration of the stabilizer used in the laser chamber according to a third example of the second embodiment.

FIG. 8 is a plan view showing the configuration of the stabilizer 24 used in the laser chamber according to a third example of the second embodiment. A larger number of grooves than the second example are formed on the guide surface 26 of the stabilizer 24, and each groove may have the bottom surface 27.

As shown in FIGS. 7 and 8, the position f(Z) of the end portion 25 may change periodically in accordance with the value of Z. A length in the Z direction of a portion corresponding to one cycle of the periodic change of the position f(Z) of the end portion 25 is defined as a cycle P of the position f(Z) of the end portion 25. As described with reference to FIGS. 2 and 3, when the cycle P is shortened, it can be expected that many parts of the acoustic waves W1, W2 having different phases interfere with and weaken each other.

3.2 Effect

Figure 9:
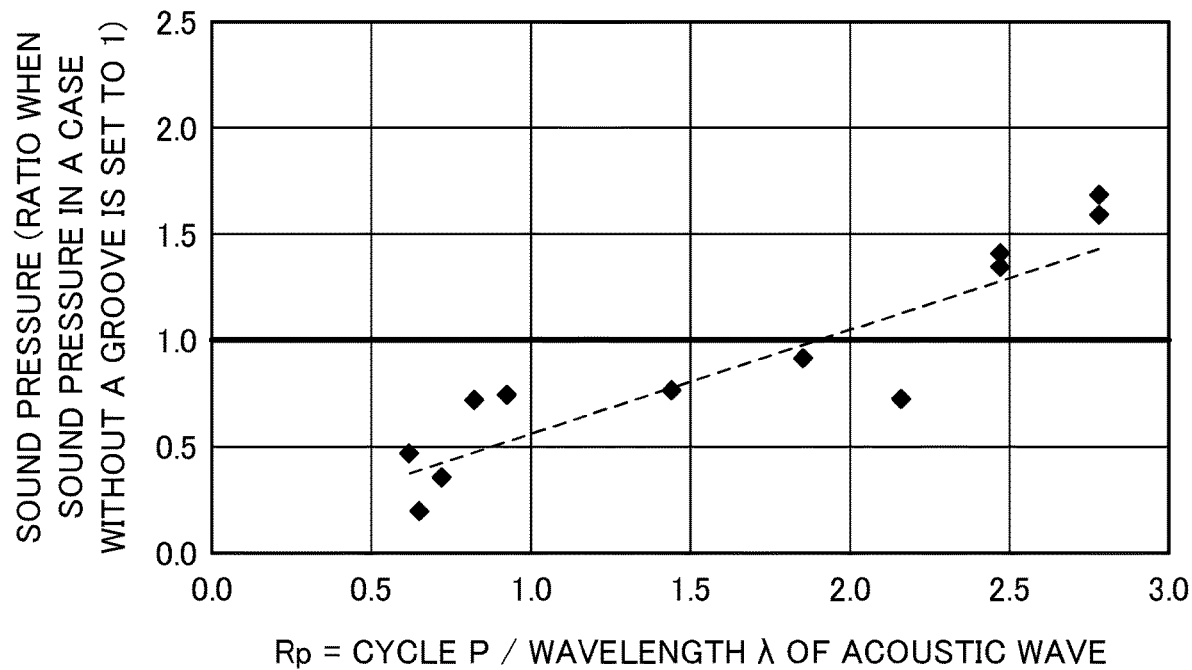
FIG. 9 is a graph showing a measurement result of sound pressure in the second embodiment.

FIG. 9 is a graph showing a measurement result of sound pressure in the second embodiment. Here, the sound pressure refers to the displacement amount of pressure due to the acoustic waves W1, W2. A sound pressure meter (not shown) installed in the discharge space S was used to measure the sound pressure. The vertical axis of FIG. 9 shows the ratio of the sound pressure when the sound pressure in the comparative example including the stabilizer 24 without a groove is set to 1. The horizontal axis of FIG. 9 shows a value Rp obtained by dividing the cycle P of the position f(Z) of the end portion 25 by the wavelength $\lambda$ of the acoustic waves W1, W2. The reason why the cycle P is divided by the wavelength $\lambda$ is as follows. The measurement result shown in FIG. 9 is a result measured with the inside of the container 10 filled with atmospheric air and the pressure in the container 10 set to atmospheric pressure. Therefore, the sound velocity of the acoustic wave at the time of measurement may differ from the sound velocity when the laser chamber of the second embodiment is actually operated as a discharge-excitation-type gas laser apparatus. Therefore, the value Rp obtained by dividing the cycle P by the wavelength $\lambda$ is used as a parameter that is not easily affected by the sound velocity of the acoustic wave.

According to the measurement result shown in FIG. 9, the sound pressure tends to decrease as the value Rp decreases. An approximate straight line obtained from the measurement result of FIG. 9 is shown by a broken line in FIG. 9. According to the approximate straight line, the sound pressure can be lower than that of the comparative example when the value Rp is 2 or smaller, that is, when the cycle P is equal to or smaller than twice the wavelength $\lambda$. Therefore, it is preferable that the cycle P is equal to or smaller than twice the wavelength $\lambda$. Thus, the acoustic waves W1, W2 having different phases can interfere with and weaken each other.

The wavelength $\lambda$ [m] of the acoustic wave is given by the following expression, where f [Hz] is the frequency of the acoustic wave and a [m/s] is the sound velocity in gas.

$$\lambda = a/f$$

Here, the frequency f [Hz] of the acoustic wave is expressed by the following expression using the number of revolution p per minute [rpm] of the cross flow fan 20 and the number N of blades 23.

$$f = pN/60$$

Further, the sound velocity a [m/s] in gas is expressed by the following expression using the ratio of specific heat $\gamma$, the average molecular weight M, and the temperature T of gas, and the gas constant R.

$$a = \sqrt{(\gamma RT/M)}$$

where $\sqrt{(X)}$ is the positive square root of X.

From the above, the wavelength $\lambda$ [m] of the acoustic wave can be calculated by the following expression.

$$\lambda = (60/pN) * \sqrt{(\gamma RT/M)}$$

From the composition of the laser gas, the temperature range of the laser gas, the number N of blades 23, the number of revolution p of the cross flow fan 20, and the like, it is considered that the wavelength λ of the acoustic wave when the laser chamber of the second embodiment is actually operated as a discharge-excitation-type gas laser apparatus is, for example, 130 mm or larger and 170 mm or smaller.

Therefore, by setting the cycle P of the position f(Z) of the end portion 25 to be 340 mm or smaller, reduction of the acoustic waves W1, W2 due to interference can be expected.

The cycle P is preferably twice or more the difference D between the maximum value and the minimum value of the position f(Z) of the end portion 25. Thus, turbulence at the grooves formed on the guide surface 26 can be suppressed, and the laser gas can be efficiently supplied to the discharge space S.

4. Inclination Angle of Bottom Surface of Groove

4.1 Configuration

Figure 10:
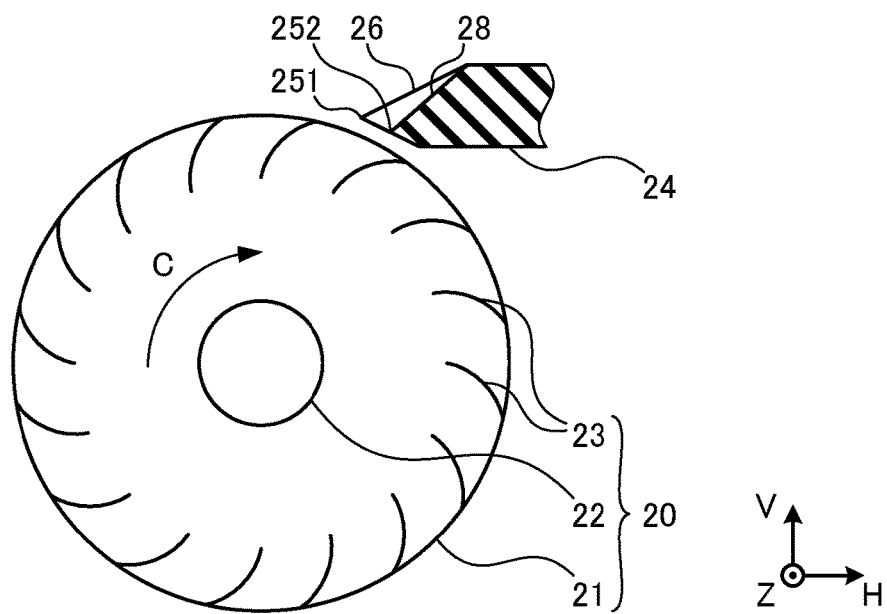
FIG. 10 is a sectional view showing the configuration of the stabilizer used in the laser chamber according to a third embodiment of the present disclosure.

FIG. 10 is a sectional view showing the configuration of the stabilizer 24 used in the laser chamber according to a third embodiment of the present disclosure. FIG. 10 shows the section corresponding to FIG. 4A. In the third embodiment, the groove formed on the guide surface 26 has a bottom surface 28 instead of the bottom surface 27. The bottom surface 28 may not be parallel to the guide surface 26 but may be inclined at an angle steeper than an inclination angle of the guide surface 26. That is, the guide surface 26 and the bottom surface 28 may be formed at an inclination angle such that the guide surface 26 and the bottom surface 28 approach each other as they become distant from the cross flow fan 20.

In other respects, the third embodiment may be similar to the first or second embodiment.

4.2 Effect

According to the third embodiment, the laser gas flowing along the guide surface 26 and the laser gas flowing along the groove can be efficiently merged and supplied to the discharge space S.

5. Stepped End Portion

5.1 Configuration

Figure 11A:
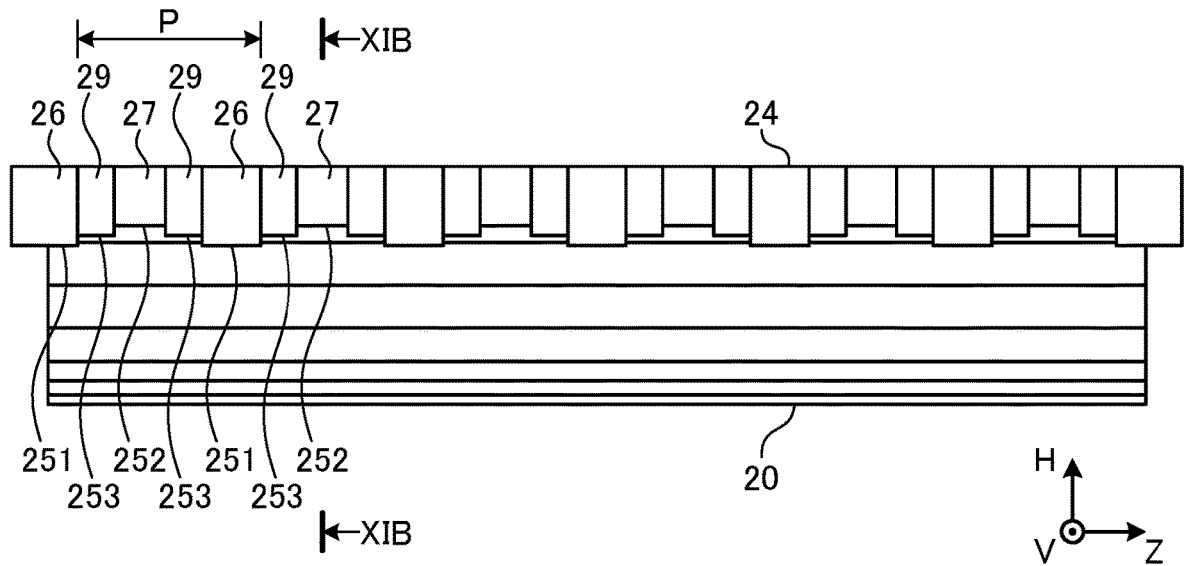
FIG. 11A is a plan view showing the configuration of the stabilizer used in the laser chamber according to a fourth embodiment of the present disclosure.

FIG. 11A is a plan view showing the configuration of the stabilizer 24 used in the laser chamber according to a fourth embodiment of the present disclosure. FIG. 11A shows the section corresponding to any one of FIGS. 6 to 8.

Figure 11B:
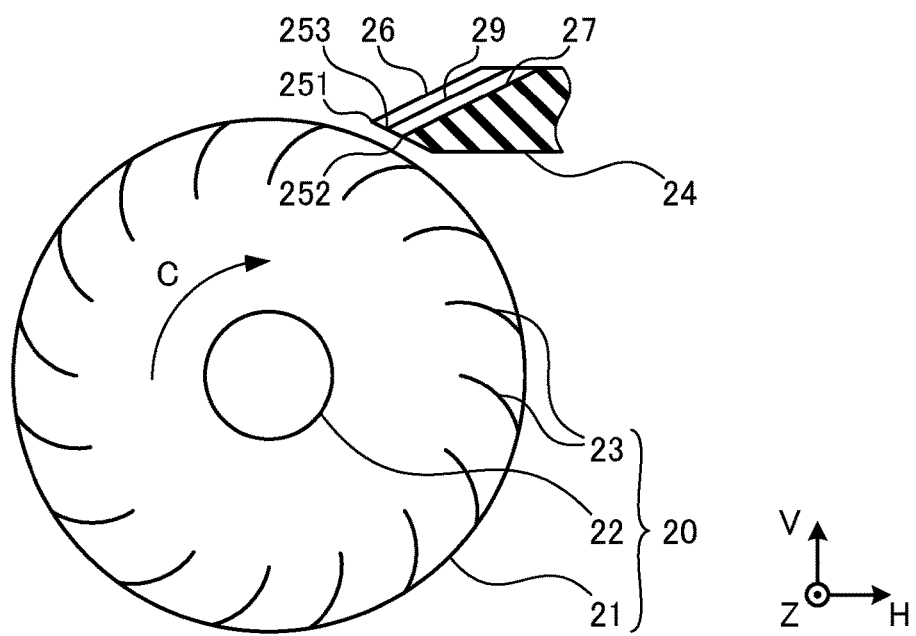
FIG. 11B is a sectional view showing the configuration of the stabilizer used in the laser chamber according to the fourth embodiment.

FIG. 11B is a sectional view showing the configuration of the stabilizer 24 used in the laser chamber according to the fourth embodiment. FIG. 11B corresponds to an enlarged view of a cross-section along line XIB-XIB in FIG. 11A. FIG. 11B shows the section corresponding to FIG. 4A.

In the fourth embodiment, the end portion 25 of the stabilizer 24 includes a third portion 253 between the first portion 251 and the second portion 252 in addition to the first portion 251 and the second portion 252. The groove formed on the guide surface 26 has an intermediate surface 29 between the bottom surface 27 and the guide surface 26 in addition to the bottom surface 27 which is the deepest. The guide surface 26, the bottom surface 27, and the intermediate surface 29 are, for example, substantially parallel to each other.

Thus, the position f(Z) of the end portion 25 changes in a stepped shape between the first portion 251 and the third portion 253, and between the third portion 253 and the second portion 252.

In other respects, the fourth embodiment may be similar to any one of the first to third embodiments.

5.2 Effect

According to the fourth embodiment, a sudden fluctuation in the pressure of the laser gas between the first portion 251 and the second portion 252 can be suppressed.

6. Triangular-Wave-Shaped End Portion

6.1 Configuration

Figure 12:
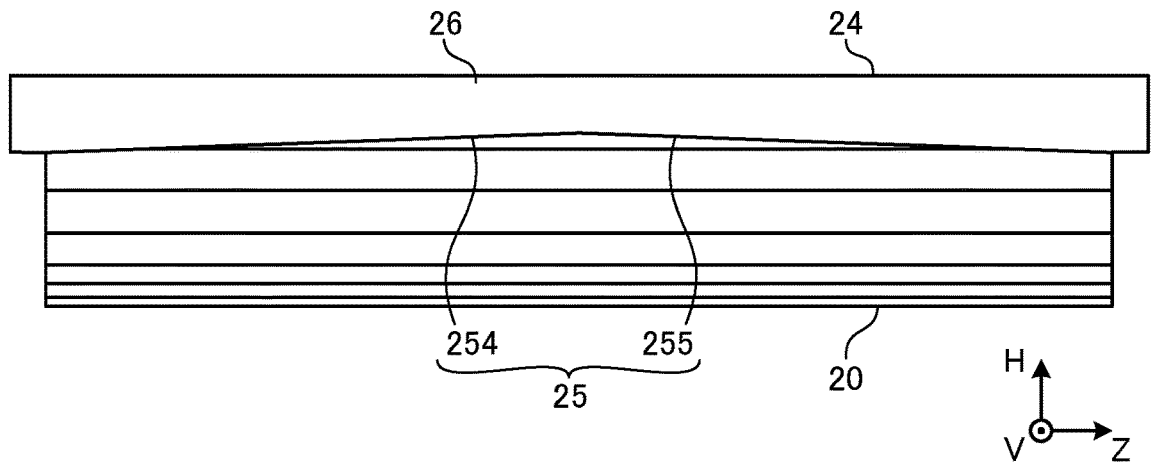
FIG. 12 is a plan view showing the configuration of the stabilizer used in the laser chamber according to a first example of a fifth embodiment of the present disclosure.

FIG. 12 is a plan view showing the configuration of the stabilizer 24 used in the laser chamber according to a first example of a fifth embodiment of the present disclosure. The end portion 25 of the stabilizer 24 may include a first inclination portion 254 and a second inclination portion 255.

Figure 13:
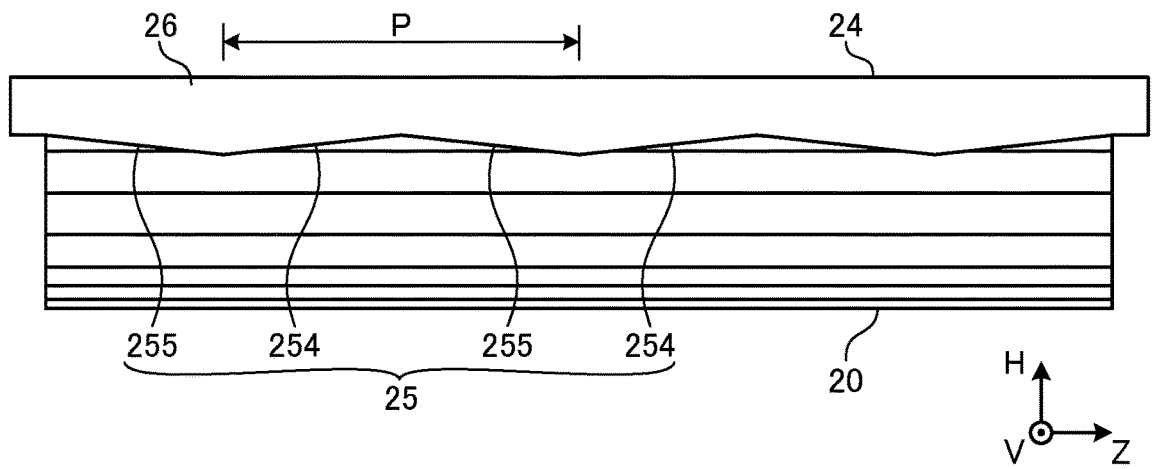
FIG. 13 is a plan view showing the configuration of the stabilizer used in the laser chamber according to a second example of the fifth embodiment.

FIG. 13 is a plan view showing the configuration of the stabilizer 24 used in the laser chamber according to a second example of the fifth embodiment. The end portion 25 of the stabilizer 24 may include a plurality of the first inclination portions 254 and a plurality of the second inclination portions 255. The first inclination portions 254 and the second inclination portions 255 may be alternately arranged.

Figure 14:
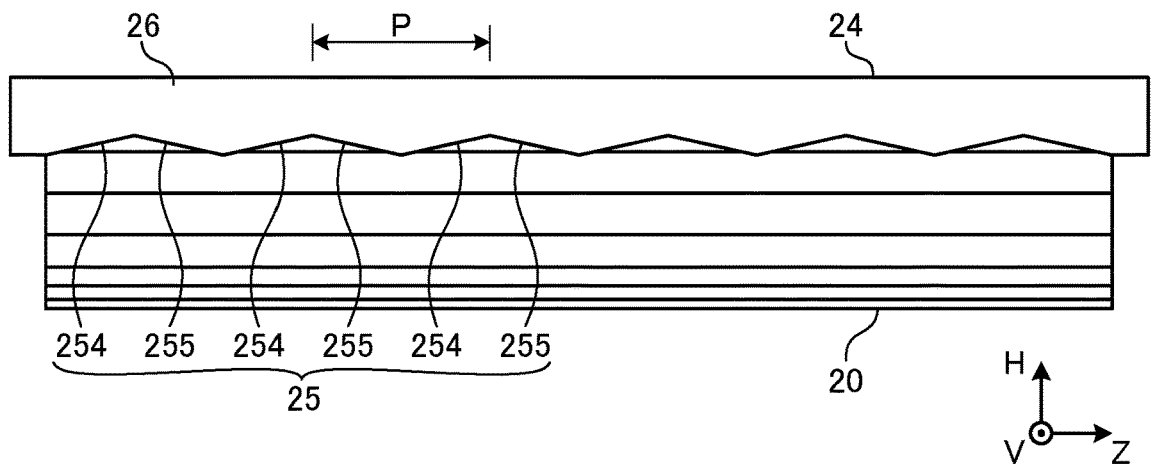
FIG. 14 is a plan view showing the configuration of the stabilizer used in the laser chamber according to a third example of the fifth embodiment.

FIG. 14 is a plan view showing the configuration of the stabilizer 24 used in the laser chamber according to a third example of the fifth embodiment. The end portion 25 of the stabilizer 24 may include a larger number of the first inclination portions 254 and the second inclination portions 255 than the second example. The first inclination portions 254 and the second inclination portions 255 may be alternately arranged.

As shown in FIGS. 12 to 14, the end portion 25 is not limited to a rectangular wave shape or a stepped shape, and may be a triangular wave shape. That is, the position f(Z) of the end portion 25 may change in a triangular wave shape along the first inclination portions 254 and the second inclination portions 255. The difference D between the maximum value and the minimum value of the position f(Z) of the end portion 25 is preferably larger than 0 and smaller than the blade interval G.

In other respects, the fifth embodiment may be similar to any one of the first to fourth embodiments.

6.2 Effect

According to the fifth embodiment, the phase of the acoustic waves generated in the vicinity of the end portion 25 can be changed continuously, that is, steplessly in accordance with the position Z in the axial direction of the cross flow fan 20. Further, as shown in FIG. 14, when the cycle P of the position f(Z) of the end portion 25 is short, it can be expected that many parts of the acoustic waves having different phases interfere with and weaken each other.

7. Relation with Partition Plate

7.1 Configuration

Figure 15:
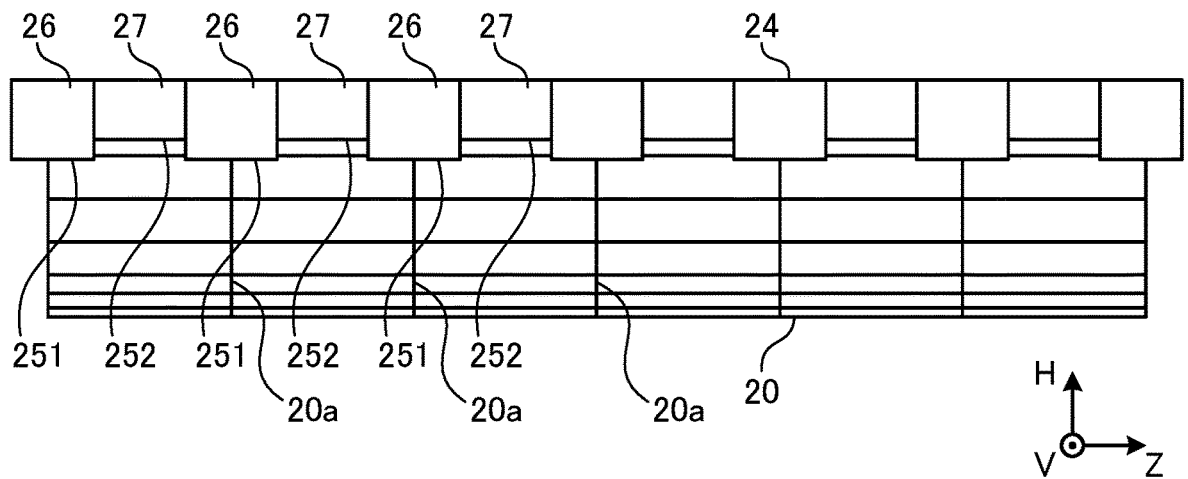
FIG. 15 is a plan view showing the configuration of the cross flow fan and the stabilizer used in the laser chamber according to a sixth embodiment of the present disclosure.

FIG. 15 is a plan view showing the configuration of the cross flow fan 20 and the stabilizer 24 used in the laser chamber according to a sixth embodiment of the present disclosure. The configuration of the stabilizer 24 is similar to that described with reference to FIG. 8.

The cross flow fan 20 further includes a plurality of partition plates 20a arranged perpendicularly to the rotation shaft 22. The partition plates 20a each have a disk shape. The partition plates 20a may each have a diameter slightly larger than the outer edge 21 of the rotation trajectory of the blades 23. The partition plates 20a secure rigidity of the cross flow fan 20 by fixing the blades 23 to each other.

The partition plates 20a are preferably arranged at positions corresponding to the first portions 251 in the axial direction of the cross flow fan 20. Alternatively, the first portions 251 are preferably arranged at positions corresponding to the partition plates 20a in the axial direction of the cross flow fan 20.

In other respects, the sixth embodiment may be similar to any one of the first to fifth embodiments.

7.2 Effect

The first portions 251 protrude further toward the distal end of the stabilizer 24 than the second portions 252. Further, the partition plates 20a protrude outward from the outer edge 21 of the rotation trajectory of the blades 23. Therefore, by designing the positional relation between the stabilizer 24 and the cross flow fan 20 with reference to the first portions 251 and the partition plates 20a, it is possible to suppress the stabilizer 24 and the cross flow fan 20 from contacting each other.

8. Others

Figure 16:
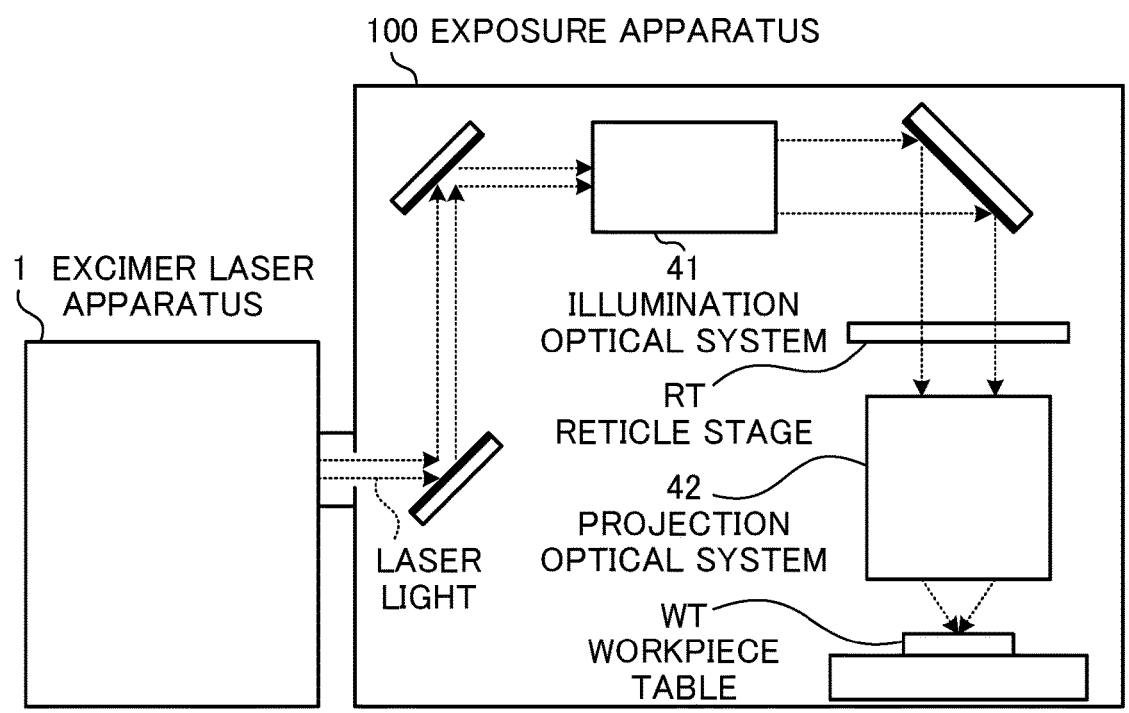
FIG. 16 schematically shows the configuration of an exposure apparatus connected to an excimer laser apparatus.

FIG. 16 schematically shows the configuration of an exposure apparatus 100 connected to an excimer laser apparatus 1. The excimer laser apparatus 1 as the discharge-excitation-type gas laser apparatus including the laser chamber according to any of the embodiments described above generates laser light and emits the laser light to the exposure apparatus 100.

In FIG. 16, the exposure apparatus 100 includes an illumination optical system 41 and a projection optical system 42. The illumination optical system 41 illuminates a reticle pattern of a reticle stage RT with the laser light incident from the excimer laser apparatus 1. The projection optical system 42 causes the laser light transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 100 synchronously translates the reticle stage RT and the workpiece table WT to expose the workpiece to the laser light reflecting the reticle pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A laser chamber of a discharge-excitation-type gas laser apparatus, comprising:
    a container which contains laser gas therein;
    a pair of discharge electrodes arranged in the container;
    a cross flow fan configured to supply the laser gas to a discharge space between the discharge electrodes, the cross flow fan including a rotation shaft with which the cross flow fan rotates in a predetermined rotation direction and a plurality of blades, each longitudinal direction of which is parallel to an axial direction of the rotation shaft; and
    a stabilizer arranged outside a rotation trajectory of the cross flow fan, and arranged such that a difference between a maximum position and a minimum position of an end portion in the rotation direction on a side opposite to the rotation direction is larger than 0 and is smaller than an interval of two blades adjacent to each other among the plurality of blades,
    wherein a position of the end portion in the rotation direction changes in accordance with a position of the end portion in the axial direction, and
    wherein a cycle of the position of the end portion in the rotation direction is equal to or smaller than twice a wavelength of an acoustic wave generated between the cross flow fan and the stabilizer.

2. The laser chamber according to claim 1, wherein the difference is larger than one quarter of the interval of the two blades and smaller than three quarters of the interval of the two blades.

3. The laser chamber according to claim 1, wherein a cycle of the position of the end portion in the rotation direction is equal to or larger than twice the difference.

4. The laser chamber according to claim 1, wherein the position of the end portion in the rotation direction changes in a rectangular wave shape between a first value and a second value.

5. The laser chamber according to claim 1, wherein the position of the end portion in the rotation direction changes in a stepped shape between a first value and a second value.

6. The laser chamber according to claim 1, wherein the position of the end portion in the rotation direction changes in a triangular wave shape between a first value and a second value.

7. The laser chamber according to claim 1, wherein the cross flow fan further includes a plurality of partition plates arranged perpendicularly to the rotation shaft at positions each corresponding in the axial direction to the minimum position of the end portion in the rotation direction.

8. The laser chamber according to claim 1, wherein the stabilizer includes a guide surface which configures a part of a wall surface of a flow path of the laser gas flowing toward the discharge space and on which a plurality of grooves are formed.

9. The laser chamber according to claim 8, wherein bottom surfaces of the plurality of grooves are parallel to the guide surface.

10. The laser chamber according to claim 8,
wherein bottom surfaces of the plurality of grooves are inclined with respect to the guide surface.

11. A laser chamber of a discharge-excitation-type gas laser apparatus, comprising:
a container which contains laser gas therein;
a pair of discharge electrodes arranged in the container;
a cross flow fan configured to supply the laser gas to a discharge space between the discharge electrodes, the cross flow fan including a rotation shaft with which the cross flow fan rotates in a predetermined rotation direction and a plurality of blades, each longitudinal direction of which is parallel to an axial direction of the rotation shaft; and
a stabilizer arranged outside a rotation trajectory of the cross flow fan, and arranged such that a difference between a maximum position and a minimum position of an end portion in the rotation direction on a side opposite to the rotation direction is larger than 0 and is smaller than an interval of two blades adjacent to each other among the plurality of blades,
wherein the stabilizer includes a guide surface which configures a part of a wall surface of a flow path of the laser gas flowing toward the discharge space and on which a plurality of grooves are formed.

12. The laser chamber according to claim 11,
wherein bottom surfaces of the plurality of grooves are parallel to the guide surface.

13. The laser chamber according to claim 11,
wherein bottom surfaces of the plurality of grooves are inclined with respect to the guide surface.

14. An electronic device manufacturing method, comprising:
generating laser light using an excimer laser apparatus including a laser chamber;
emitting the laser light to an exposure apparatus; and
exposing a photosensitive substrate to the laser light in the exposure apparatus to manufacture an electronic device,
the laser chamber including:
a container which contains laser gas therein;
a pair of discharge electrodes arranged in the container;
a cross flow fan configured to supply the laser gas to a discharge space between the discharge electrodes, the cross flow fan including a rotation shaft with which the cross flow fan rotates in a predetermined rotation direction and a plurality of blades, each longitudinal direction of which is parallel to an axial direction of the rotation shaft; and
a stabilizer arranged outside a rotation trajectory of the cross flow fan, and arranged such that a difference in the rotation direction between a maximum position and a minimum position of an end portion on a side opposite to the rotation direction is larger than 0 and is smaller than an interval of two blades adjacent to each other among the plurality of blades blades,
wherein a position of the end portion in the rotation direction changes in accordance with a position of the end portion in the axial direction, and
wherein a cycle of the position of the end portion in the rotation direction is equal to or smaller than twice a wavelength of an acoustic wave generated between the cross flow fan and the stabilizer.

* * * * *